(12) United States Patent
Sadeghi et al.

(10) Patent No.: US 11,036,202 B2
(45) Date of Patent: Jun. 15, 2021

(54) REAL-TIME HEALTH MONITORING OF SEMICONDUCTOR MANUFACTURING EQUIPMENT

(71) Applicant: Lam Research Corporation, Fremont, CA (US)

(72) Inventors: Hossein Sadeghi, Glendale, CA (US); Scott Baldwin, Reston, VA (US)

(73) Assignee: Lam Research Corporation, Fremont, CA (US)

( * ) Notice: Subject to any disclaimer, the term of this patent is extended or adjusted under 35 U.S.C. 154(b) by 51 days.

(21) Appl. No.: 16/219,818

(22) Filed: Dec. 13, 2018

(65) Prior Publication Data

US 2020/0192325 A1 Jun. 18, 2020

(51) Int. Cl.
*G05B 19/4065* (2006.01)
*H01L 21/67* (2006.01)

(52) U.S. Cl.
CPC .... *G05B 19/4065* (2013.01); *H01L 21/67201* (2013.01); *H01L 21/67242* (2013.01); *G05B 2219/45031* (2013.01)

(58) Field of Classification Search
CPC ...... G05B 19/4065; G05B 2219/45031; H01L 21/67201; H01L 21/67242
USPC ........................................................ 700/121
See application file for complete search history.

(56) References Cited

U.S. PATENT DOCUMENTS

| | | |
|---|---|---|
| 6,048,154 A | 4/2000 | Wytman |
| 6,594,589 B1 | 7/2003 | Coss, Jr. et al. |
| 7,937,178 B2 | 5/2011 | Moriya |
| 8,055,370 B1 | 11/2011 | Achtnig et al. |
| 2002/0016068 A1* | 2/2002 | Nakano ................. C23C 14/564 438/689 |
| 2003/0172508 A1* | 9/2003 | Halsey .................. C23C 14/566 29/25.01 |
| 2006/0181699 A1* | 8/2006 | Numakura ........ H01L 21/67167 356/237.2 |

(Continued)

FOREIGN PATENT DOCUMENTS

| | | |
|---|---|---|
| JP | 2002324829 A | 11/2002 |
| KR | 101415262 B1 | 7/2014 |

OTHER PUBLICATIONS

PCT/US2019/065565, International Search Report, PCT/ISA/210, dated Apr. 8, 2020.

*Primary Examiner* — Jigneshkumar C Patel
(74) *Attorney, Agent, or Firm* — Penilla IP, APC (57) ABSTRACT

Systems and methods for real time semiconductor manufacturing cluster tool health monitoring are provided via an in-situ sensor. In a method embodiment, an operation procedure for pumping/venting load lock (LL), and LL doors facing vacuum transfer module (VTM) and equipment front end module (EFEM), sensor installation location and operation procedure, and data flow and analysis process are provided. The sensor provides real-time data and monitors airborne particle contamination on EFEM, load lock (LL), and VTM, and plurality of process modules (PMs) simultaneously by correlating door open/close time and vent/pump timing in the loadlock to the particle measurement data. The method further provides an operation for determining that a maintenance procedure is recommended on one of the EFEM, the LL, the VTM, or the plurality of PMs based on the real time measurement data, door state data, and using machine learning algorithms.

20 Claims, 9 Drawing Sheets

(56) References Cited

U.S. PATENT DOCUMENTS

| | | | |
|---|---|---|---|
| 2007/0144670 A1* | 6/2007 | Moriya | B08B 9/08 |
| | | | 156/345.29 |
| 2008/0052251 A1 | 2/2008 | Moriya | |
| 2008/0110233 A1 | 5/2008 | Tanaka et al. | |
| 2010/0119351 A1* | 5/2010 | Liu | H01L 21/67201 |
| | | | 414/805 |
| 2012/0138085 A1* | 6/2012 | Huang | B08B 6/00 |
| | | | 134/1.1 |
| 2016/0148850 A1* | 5/2016 | David | H01L 22/20 |
| | | | 438/5 |
| 2018/0040460 A1 | 2/2018 | Gottscho | |
| 2019/0108987 A1* | 4/2019 | Tetsuka | H01J 37/32825 |
| 2019/0294151 A1* | 9/2019 | Ohashi | H01L 21/67196 |

* cited by examiner

| Step | Wafer movement/ location | ATM/EFEM-facing Door | VTM-facing door | LL pressure | Particle movement | Sensor |
|---|---|---|---|---|---|---|
| 1 | EFEM to LL | Open | Closed | ATM | EFEM to LL | On (counting EFEM particles) |
| 2 | LL | Closed | Closed | Pump to vacuum | None | Off |
| 3 | LL to VTM | Closed | Open | Vacuum | Both/Low | Off |
| 4 | VTM to LL | Closed | Open | Vacuum | VTM to LL | Off |
| 5 | LL | Closed | Closed | Vent to ATM | None | Off |
| 6 | LL | Closed | Closed | ATM | None | On (counting VTM particles) |
| 7 | LL to EFEM | Open | Closed | ATM | LL to EFEM and EFEM to LL | Off (or on to count EFEM particles) |

Fig. 9

REAL-TIME HEALTH MONITORING OF SEMICONDUCTOR MANUFACTURING EQUIPMENT

BACKGROUND

1. Field of the Invention

The present disclosure relates to systems and methods of semiconductor manufacturing, and more particularly to monitoring the health of semiconductor manufacturing equipment for early detection of the tool malfunction.

2. Description of the Related Art

In the manufacture of semiconductor devices, cluster tools having multiple processing modules (PMs), stations, and a vacuum transfer module (VTM) are used for transporting substrates between the PMs. The cluster tool generally operates at vacuum conditions to match the pressures desired for the various PMs. A substrate is typically introduced into the cluster tool from atmosphere via an equipment front end module (EFEM) (e.g., of a clean room), which may include an atmospheric transfer module (ATM). The EFEM and the VTM of the cluster tool are hermetically separated by a load lock, which maintains the pressure of the EFEM or the VTM during substrate transport into and out of the cluster tool. The load lock is cyclically pumped down to vacuum prior to interfacing with the VTM and vented (e.g., with nitrogen) to atmosphere prior to interfacing with the EFEM.

Currently, there are barriers to monitoring tool health in an automated way. First, there is little extraneous space within the cluster tool to place monitoring equipment due to the efficient usage of space within the EFEM, VTM, and the PMs. Additionally, even if there were space, monitoring equipment may not be operable at the vacuum conditions of the cluster tool. Thus, there is a need in the industry to provide real-time and automatic tool health monitoring for early detection of tool performance anomalies, and for timely prompting an operator for maintenance to reduce tool down time.

It is in this context that embodiments arise.

SUMMARY

Methods and systems for real-time tool health monitoring are provided. Embodiments described include methods and system that use in-situ sensors to monitor airborne particles, the measurement data of which is used to monitor the maintenance needs of a semiconductor processing system. Further, door state data relating to timing various doors open/close operation within the semiconductor processing system is used to identify the source of the airborne particles to provide a recommendation as to a maintenance procedure.

In one embodiment, a method is provided. The method includes an operation for pumping down a load lock (LL) to a vacuum pressure to match a pressure of a vacuum transfer module (VTM) while both the equipment front end module (EFEM)-facing door and a VTM-facing door are closed. The LL interfaces with the VTM via the VTM-facing door and with an EFEM via the EFEM-facing door, wherein the VTM is interfaces with a plurality of processing modules (PMs) having a respective plurality of PM doors. The method also includes an operation for opening the VTM-facing door such that airborne particles when present in the VTM are allowed to diffuse into the LL, the airborne particles originate from the VTM or the plurality of PMs. The method further includes operations for closing the VTM-facing door and venting the LL to atmosphere and for obtaining, using a sensor in fluid communication with the LL, measurement data of the airborne particles that diffused into the LL during said opening the VTM-facing door. The method moreover includes an operation for determining, using a maintenance detection module, that a maintenance procedure is recommended on one of the LL, the VTM, or the plurality of PMs based on a quantification of the measurement data.

In another embodiment, another method is provided. The method includes an operation for opening an EFEM-facing door of an LL while a VTM-facing door is closed, the LL interfaced with an EFEM via the EFEM-facing door and with a VTM via the VTM-facing door. Opening the EFEM-facing door allows airborne particles when present in the EFEM to diffuse into the LL. The method also includes an operation for obtaining, using a sensor in fluid communication with the LL, measurement data of the airborne particles that diffused into the LL from the EFEM. The operation further includes an operation for determining, using a maintenance detection module, that a maintenance procedure is recommended on either the LL or the EFEM based on quantification of the measurement data.

In another embodiment, a system is provided. The system includes an LL that interfaces with an EFEM via an EFEM-facing door and with a VTM via a VTM-facing door, wherein the VTM is configured to interface a plurality of PMs having PM doors. The system also includes a sensor in fluid communication with the LL for obtaining measurement data of airborne particles that diffuse into the LL from the EFEM or the VTM. The system further includes a valve disposed along a line between the sensor and the LL, the valve is opened when the pressure of the LL is at atmosphere and closed when the pressure of the LL is at vacuum. The system moreover includes a computer module configured for processing measurement data received from the sensor for determining that a maintenance procedure is recommended on one of the LL, the VTM, the EFEM, or the plurality of PMs.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems, methods, and devices for monitoring the health of components of a cluster tool used for semiconductor manufacturing. Embodiments presented here describe solutions to current difficulties of performing real-time and automated monitoring of tool health. The health of a cluster tool refers generally to the physical state of the cluster tool, including the physical state of any subset of components thereof. Tool health may also refer to whether or not one or more components of the tool requires or would be functionally or structurally benefited by maintenance, repair, cleaning, replacement, refurbishment, or the like. Embodiments described here provide data related to tool health monitoring in an automated way by measuring airborne particles originating from various internal components of a cluster tool. The measurement data of the airborne particles (e.g., particle count, particles size, etc.) are correlated with component usage data (e.g., number of rotations made by a pivot, amount of time a door is open/closed) to identify one or more components that would be benefited from maintenance and the nature and extent of such maintenance. The process of identification of a component that would benefit from maintenance and the approximation of the nature and extent of the maintenance may be referred to as maintenance detection. Embodiments contemplated here use machine-learning to improve the correlation process between the measurement data of airborne particles with required maintenance detection.

A typical cluster tool may have tens of thousands of individual parts. A subset of those parts may require regular or occasional maintenance, including manual cleaning, "auto cleaning," repair, refurbishment, calibration, replacement, modification, upgradation, resurfacing, etc. In some circumstances, these parts tend to be subject to process conditions, such as plasma, electric fields, magnetic fields, high or low temperatures, high or low pressures, exposure to reactants, exposure to ultraviolet (UV) radiation, exposure to high velocity ions, etc. These components may include, for example, a substrate support, electrodes, chamber walls, showerheads, chucks, exclusion rings, wafer contact supports, etc. Additionally, some of these parts are subject mechanical wear, for example from friction due to angular or linear movement and from physical deformation. These components may include bearings, motors, O-rings, gaskets, door seals, pistons, etc. These conditions or physical changes to component properties may generally be referred to as degradation, or deterioration, or diminution.

One of the primary markers or indications of component degradation, and thus maintenance, is the release or sublimation of particles into a gaseous state. This is especially true under vacuum conditions, where the energy required to sublimate is reduced compared to atmosphere. When a component such as a seal is repeatedly subject to either process conditions or friction or deformation, the component experiences enough "wear and tear" to cause its underlying intermolecular, supramolecular, or even composition to change. These molecular changes typically result in the separation of particles of the underlying monolithic part at the surface at which the part contacts open space. It is from this surface that individual particles sublimate or otherwise become airborne. As a result, airborne particles are indicative of wear in a part as well as its need from maintenance.

Tool monitoring such as by detecting these airborne particles have hitherto presented certain challenges. From an architectural standpoint, cluster tools are designed to occupy as small a footprint as practicable because cluster tools are operated in clean rooms, the space of which is valuable. Moreover, because of the dynamic nature of the temperature and pressure of processing modules (PMs), the internal volume of cluster tools is also kept to a minimum to reduce the time and expense it takes to, for example, achieve a certain temperature, pressure, or concentration of a reactant within a chamber. Thus, there very little extraneous space within a cluster tool to place monitoring equipment such as an optics-based or light-based sensor.

Furthermore, it is time consuming, inefficient, and expensive to routinely and manually inspect the cluster tool, such as the vacuum transfer module (VTM), the load lock (LL), the atmospheric transfer module (ATM) and the equipment front end module (EFEM) because doing so would require halting any processing. Additionally, manual inspection may require some extent of disassembly of the tool, resulting in even more down time. Moreover, such manual inspections may often unnecessarily halt operations or otherwise fail to detect maintenance issues until they result in defects in substrate processing. A method and system of in-situ monitoring of tool health and detecting maintenance needs is provided, enabling an operator to identify and address the maintenance need prior to failure.

Figure 1:
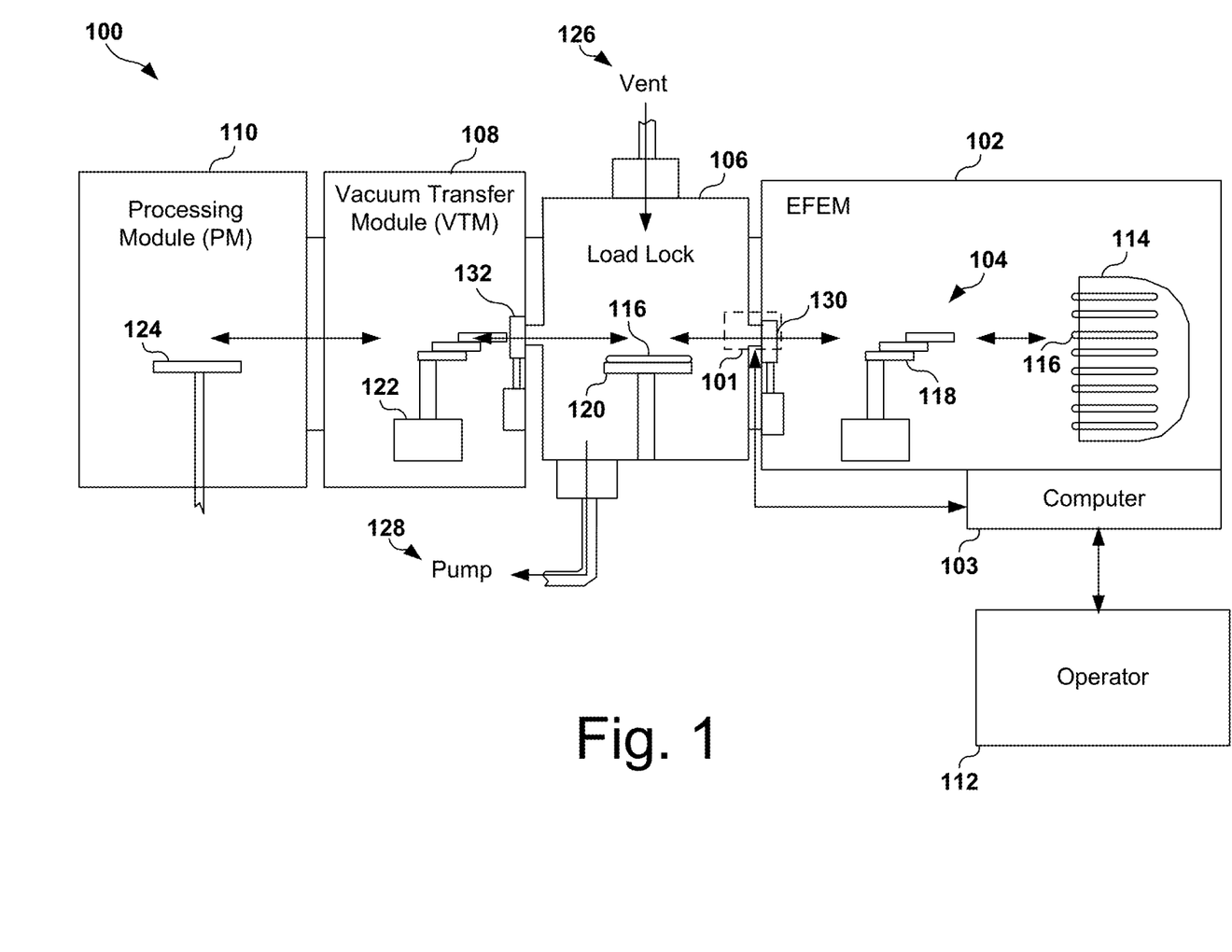
FIG. 1 depicts a semiconductor processing system illustrating various chambers of which a sensor provides in-situ health monitoring, according to one embodiment.

FIG. 1 depicts a semiconductor processing system 100 illustrating various chambers of which a sensor 101 provides in-situ health monitoring, according to one embodiment. Semiconductor processing system 100 is shown to include an equipment front end module (EFEM) 102 that an operator 112 can interface with via a computer 103 in a clean room, for example. The EFEM 102 may also interface with other semiconductor processing modules via one or more robots. A cassette 114 carrying a plurality of substrates 116 is shown to be transferred to the EFEM 102. The ATM 104 operates at atmosphere and is configured to transfer one of the substrates 116 from cassette 114 to the load lock (LL) 106. The ATM 104 positioned inside of the EFEM 102 and is equipped with at least one robotic arm 118 for performing such transfers between the LL 106 and the EFEM 102.

When the ATM 104 transfers the substrate 116 to the LL 106, the robotic arm 118 places the substrate 116 on a support 120 while an EFEM-facing door 130 is open. The EFEM-facing door 130 is then closed prior to pumping down the pressure in the LL 106 via pump 128 to match a vacuum of the vacuum transfer module (VTM) 108. Once the LL 106 is at vacuum, a VTM-facing door 132 is opened and a robotic arm 122 of the VTM 108 transfers the substrate 116 from the support 120 to a support 124 of the processing module (PM) 110. By way of example, the PM 110 may be implemented to perform plasma etching, chemical vapor deposition (CVD), atomic layer deposition (ALD), ion beam etching (IBE), sputtering, among many others.

When the substrate 116 is finished processing, the robotic arm 122 of the VTM 108 retrieves the substrate 116 from the PM 110 and places it back on the support 120. With both the VTM- and ATM-facing doors 130 and 132 closed, the LL 106 is vented to atmosphere via vent 126. Once at atmosphere, the EFEM-facing door 130 is opened so that the robotic arm 118 may retrieve the substrate 116 from the LL 106 and place it back onto the cassette 114 or some other storage structure. More than one substrate 116 may reside in LL 106 at a time. For example, as substrate 116 is placed from the VTM 108 to the LL 106, an unprocessed substrate 116 may be placed inside the LL 106. Thus, the robotic arm 122 can place a processed substrate 116 into the LL 106 and remove an unprocessed substrate 116 from the LL 106 for processing sequentially.

A sensor 101 is shown to be associated with the semiconductor processing system 100 in proximity to EFEM-facing door 130 such that it is within the LL 106 and/or the ATM 104, or is otherwise in fluid communication with the same. Other placements of the sensor 101 are contemplated and described with reference to FIG. 7. The sensor 101 is configured to measure properties of airborne particles that originate from the EFEM 102, the LL 106, the VTM 108, and the PM 110. The sensor 101 communicates with computer 103 for sending measurement data related to the airborne particle measurement. In some embodiments, the sensor 101 is configured to provide particle counts, particle size, and particle composition as measurement data to the computer 103. The computer 103 likewise communicates with the sensor 101 to instruct the sensor 101 of when to perform measurements and when not to. In some embodiments, measurement will be taken by sensor 101 at atmosphere due to the impracticality of performing certain measurements at vacuum. In some embodiments, the sensor 101 may be a sensor array having a plurality of sensors that provide measurement data for particle count, particle size, particle composition, relative humidity (RH), temperature, pressure, oxygen levels, etc. This measurement data is further usable to narrow down, for example, which compartment or components within the compartment are in need of maintenance and the nature and extent of such maintenance.

Figure 2:
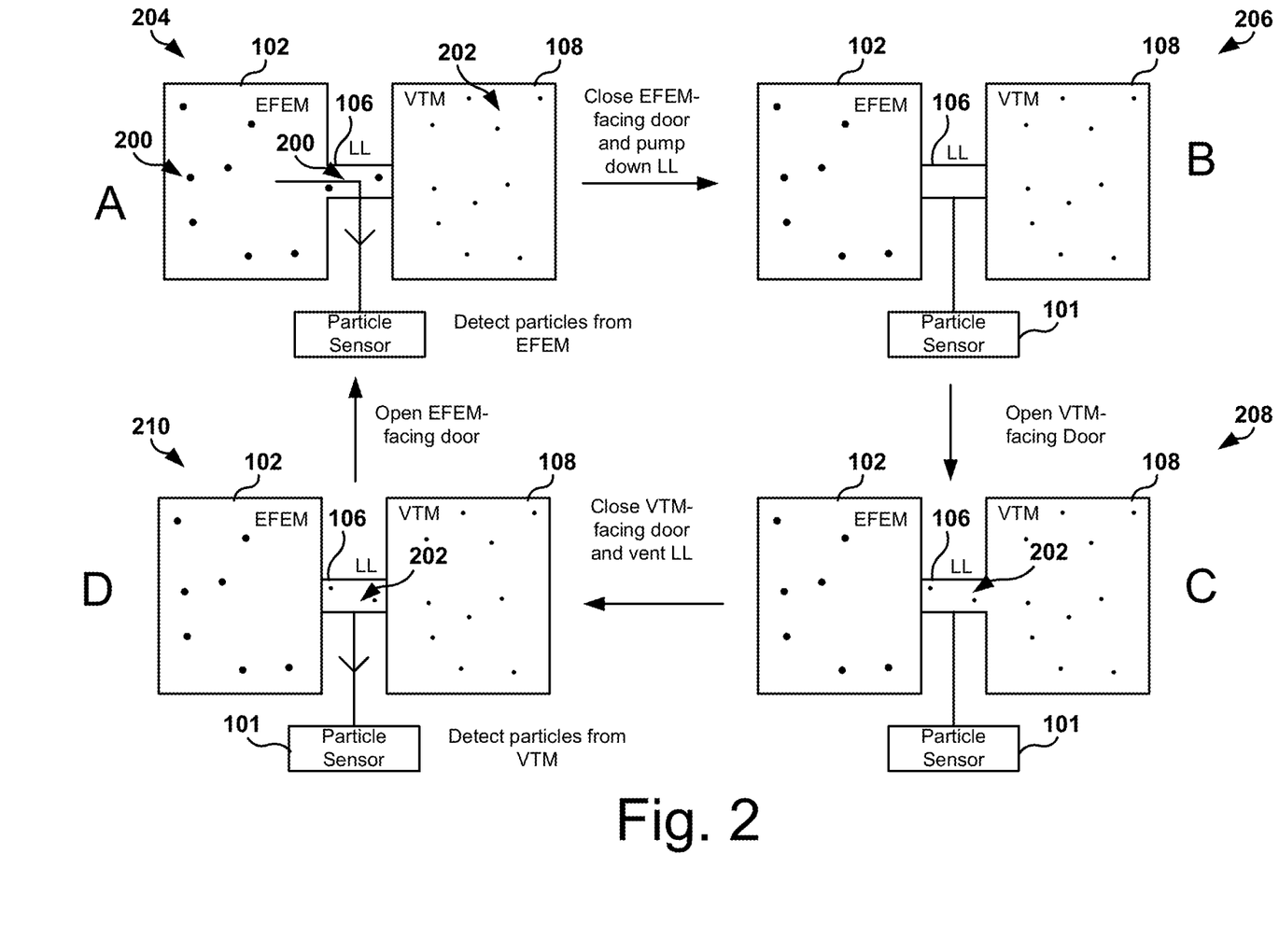
FIG. 2 depicts a conceptual diagram of particle movement and subsequent detection by sensor at various stages of the load lock (LL) during substrate transfer between the equipment front end module (EFEM) and the vacuum transfer module (VTM) and vice versa, according to one embodiment.

FIG. 2 depicts a conceptual diagram of particle movement and subsequent detection by sensor 106 at stages 204-210 of the LL 106 during substrate transfer between the EFEM 102 and the VTM 108, according to one embodiment. At stage 204, particles 200 originating from the EFEM 102 are represented as relatively larger dots, while particles 202 of the VTM 108 are represented by smaller dots. This has been done for illustrative purposes only and the relative sizes of particles 200 and 202 are not intended to reflect a size of those particles in practice. Nor are the apparent densities of particles 200 and 202 representative of the concentration or particle count of said particles within their respective chambers.

The particle sensor 101 is shown to be in fluid communication with the LL 106, for example, via a tube connected to a foreline associated with a pump. At stage 204, the EFEM-facing door (or the ATM-facing door) is shown to be open so that, for example, a substrate may be placed into the LL 106. Additionally, during stage 204, particles 200 originating from the EFEM 102 may diffuse into the LL 106. The change in concentration of particles 200, φ, in the LL 106 as a result of such diffusion may be approximated by the following equations:

$$\frac{\partial \varphi(r, t)}{\partial t} = \nabla \cdot [D(\varphi, r)\nabla \varphi(r, t)] \quad (1)$$

$$J = -D(\varphi, r)\nabla \varphi(r, t) \quad (2)$$

The change in concentration of particles 200 in the LL 106 as a result of diffusion is governed by the flux, J, of particles 200 into the LL 106. Moreover, in equation (2), D is the diffusivity of particles 200, which may itself depend upon multiple factors including the temperature and the size of the particles 200. Thus, the concentration of particles 200 in the LL 106 at stage 204 is time-dependent. By knowing, for example, the amount of time the EFEM-facing door is open along with the particle count obtained by the sensor 101, the concentration of particles originating from the EFEM 102 may be obtained.

Next, the LL 106 is evacuated by a pump to vacuum pressure similar to the vacuum of VTM 108. At stage 206, the particles 200 are shown to have been pumped out of LL 106 while both the VTM-facing door and the EFEM-facing door are closed. Because the LL 106 is at vacuum in stage 206, the sensor 101 may be instructed to be off and may be sealed-off from the vacuum of LL 106 via a valve (not shown).

Next, the VTM-facing door opens in stage 208 such that the unprocessed substrate may be transferred from the LL 106 to the VTM 108, while a processed substrate may be transferred from the VTM 108 to the LL 106. Additionally, while the VTM-facing door is open, particles 202 originating from the VTM 108 may diffuse into the LL 106. Particles 202 as shown in the VTM 108 may have a number of sources. For example, particles 202 may originate from the VTM 108 itself due to sublimation of particles from seals, bearings, motors, bushings, contact surfaces, etc. of various components associated with the VTM 108 such as the robotic arm, the VTM-facing door, or the PM doors. Additionally, particles 202 may originate from the PMs themselves as residual airborne particles that diffuse from the PMs after process when the PM doors are open.

Again, the concentration of particles 202 in LL 106 will depend upon the time that flux is allowed to occur, e.g., the VTM-facing door open time. Between stages 208 and 210, the VTM-facing door is closed, and the LL 106 is vented to achieve atmospheric pressure. In some embodiments, nitrogen gas is used for venting. At stage 210, content of the LL 106 is flown to the particle sensor 101 for detection of airborne particles originating from the VTM 108. The concentration of the particles 202 from the VTM 108 may be extrapolated from the particle count data. The concentration of particle 202 in LL 106 may stay the same during venting because the number of particles within the volume of LL 106 should not change as a result of venting.

Between stages 210 and 204, another cycle of pumping and venting may occur to clear out the particles 202 from LL 106. However, in other embodiments, this step may not be necessary. For example, the EFEM-facing door may be opened to allow particles 200 to diffuse into LL 106 while also allowing particles 202 to diffuse out of LL 106. During this period of gas exchange, the sensor 101 may be instructed to provide real-time particle count measurement data to determine if there is a net increase or decrease in particle count. If there is a net increase, this may indicate that EFEM 102 has a higher concentration of particles 200 than that of the VTM 108 of particles 202. On the other hand, if there is a net decrease in particle count, this may indicate that the VTM 108 has a higher concentration of particles 202 than that of the EFEM 102 for particles 200.

Figure 3:
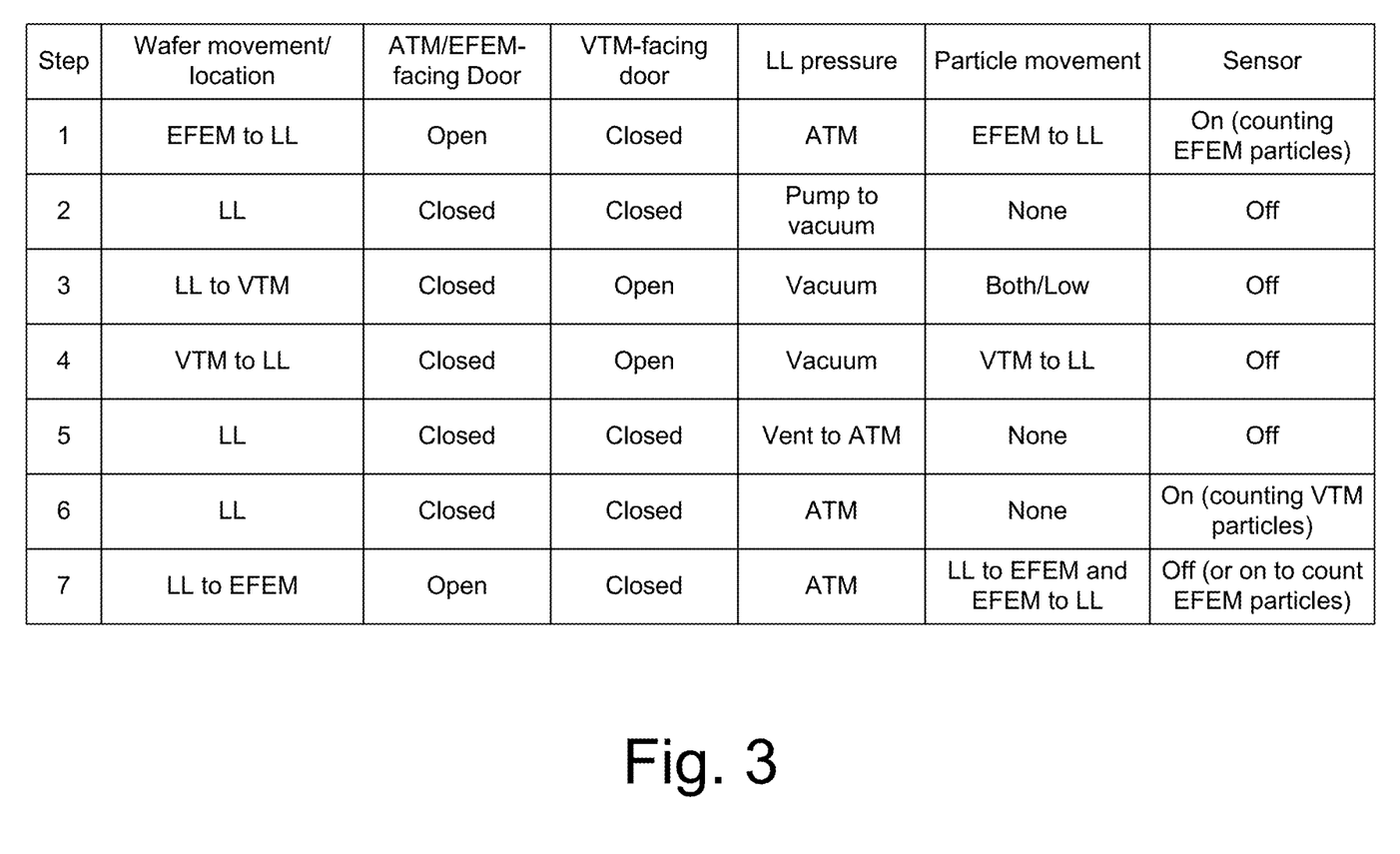
FIG. 3 depicts a table showing the various steps associated with in-situ airborne particle monitoring and counting method, according to one embodiment.

FIG. 3 depicts a table showing the various steps associated with an in-situ airborne particle monitoring and counting method, according to one embodiment. As noted above, at step 1, the wafer (unprocessed) is moved from the EFEM to the LL while the EFEM-facing door is open, and the VTM-facing door is closed. In some embodiments, step 1 may also include moving a processed wafer sitting in the LL to the EFEM prior or subsequent to the movement of the unprocessed wafer into the LL. In step 1, the sensor is on to count the particles traveling from the EFEM. In step 2, the wafer is in the LL with both the EFEM- and the VTM-doors closed while the LL pressure is pumped to vacuum. The sensor is either off or disconnected from fluid communication with the LL via a valve. This is because particle sensors do not generally perform accurately under high vacuum pressures due to lack of gas flow through the sensor channels.

At step 3, another processed wafer may be in the VTM for transfer into the LL while the unprocessed wafer moves from the LL to the VTM. Further, at step 3, there will be gas exchange between the LL and the VTM because some particles that diffused into the LL during step 1 may still be present in smaller amounts in step 3. Meanwhile, particles present in the VTM diffuse into the LL. As noted above, these particles may be of many origins, including from the VTM itself, or one of a plurality of PMs. Between steps 3 and 4, various processing procedures may be performed on the substrate at the PMs. The sequence of processing steps may generate particles that accumulate in the VTM during various transferring steps between the PMs. During processing, the VTM-facing door may be closed, and the LL may have undergone a venting and pumping cycle to transfer the processed wafer from the LL to the EFEM.

In any case, step 4 serves to transfer the now processed substrate from the VTM to the LL. In doing so, the airborne particles from the VTM that have accumulated over the span of one or more processing steps at the PMs will diffuse into the LL. The rate of diffusion into the LL will depend upon the diffusivity of the particles, which will depend upon the temperature, pressure, the mass of the molecules, the size of the molecules, the size of the opening of the VTM-facing door, and the volume of the LL. The time that the VTM-facing door is open will either be recorded, or, if it is predetermined, obtained from sequence data. Moreover, door open times and frequencies of opening will likewise be recorded for extrapolating particle origination from particle count and other measurement data. Additionally, the speed at which the doors open and close may be accounted for, as the area through which particles flux will change while the door is being opened or closed.

Steps 5 and 6 show that the airborne particles that migrated into the LL remain in the LL as the LL is vented to atmosphere. The concentration of those particles will likely not change due to venting because the volume stays constant. The airborne particles originating from the VTM accumulating during processing steps are then measured by the sensor. The cycle beings anew with step 7, where the processed wafer is transported from the LL to the EFEM in exchange for an unprocessed wafer. In step 7, the sensor may be on to determine the particle count change when the EFEM-facing door is open. At this stage, airborne particles originating from the VTM diffuse into the EFEM while those originating from the EFEM diffuse into the LL. As a result, there may be a net increase or decrease in particle count due to the gas exchange at step 7. In other embodiments, the LL may be pumped and vented for a cycle to remove the particles measured at step 6.

Figure 4:
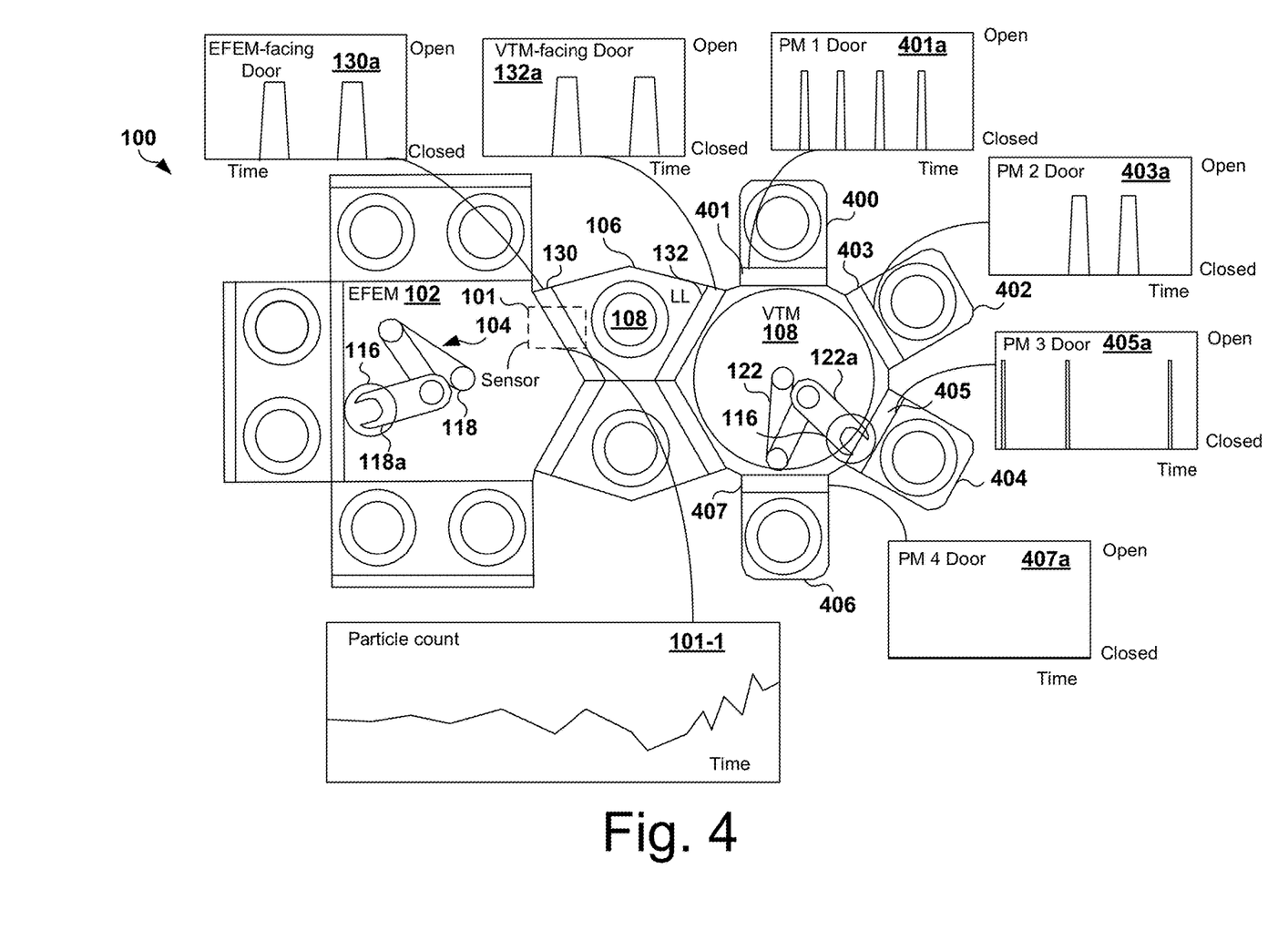
FIG. 4 shows depicts a semiconductor processing system and various door open times used for correlating particle count to a source of contamination for maintenance detection, according to one embodiment.

FIG. 4 shows depicts a semiconductor processing system 100 and various door open times used for correlating particle count 101-1 to a source of contamination for maintenance detection, according one embodiment. A substrate 116 is shown to be transferred between an EFEM 102 and a LL 106 via a robotic arm 118 of ATM 104 with end effector 118a. The substrate 116 is further transported between the LL 106 and the PMs 400, 402, 404, and 406 via robotic arm 122 with end effector 122a. The semiconductor processing system 100 shows various doors that open and close during wafer transfer and processing, which may be referred to here as "door state." That is, door state data denotes the timing of when various doors are opened or closed and for what duration. For example, an EFEM-facing door 130 is shown to be associated with an EFEM-facing door state 130a, which is a function of time. In the period shown, the EFEM-facing door state 130a is shown to have been in an open state two times. Generally, door state data may be obtained through empirical measurements, or through sequencer programming data, which instructs when each of the doors should be opened or closed according to programming. Additionally, the speed at which a door opens or closes may be obtained from manufacturer data or through empirical measurement.

In any case, the EFEM-facing door state 130a may be used to calculate the flux of particles into the LL 106 from the EFEM 102, for example, by solving equation (1) and equation (2). The same is true of VTM-facing door state 132a. Also shown as part of the semiconductor processing system 100 are four PMs 400, 402, 404, and 406, each associated with PM doors 401, 403, 405, and 407 for interfacing with the VTM 108. Each of the PM doors 401, 403, 405, and 407 are associated with PM door states 401a, 403a, 405a, and 407a. For example, PM 1 door state 401a shows that PM 1 door 401 opened and closed four times in the arbitrary span used. The amount of time the PM 1 door 401 was opened for each iteration is relatively shorter than, for example, the door open time of the VTM-facing door 132. PM 2 door state 403a shows that PM 2 door 403 opened and close two times in the span used, while PM 3 door state 405a shows that PM 3 door 405 opened and closed three times. Further PM 4 door state 407a shows the PM 4 door 407 remained closed during the span described.

The door states for PM doors 401, 403, 405, and 407 may be used to calculate the relative amount of gas exchange between each of the PMs 400, 402, 404, and 406 and the VTM 108. Thus, if particle count 101-1 reading is taken from airborne particles originating from the VTM 108 (e.g., at step 6 of FIG. 3), the particle count may be proportionally attributed to the PMs 400, 402, 404, and 406 depending upon the PM door states 401a, 403a, 405a, and 407a.

The flux will depend upon the amount of time that any of PM doors 401, 403, 405, and 407 is open as well as the way or frequency in which they are open. For example, assume that PM 1 door 401 and PM 2 door 403 are open for the same total amount of time as shown in the PM doors states 401a and 403a. Further assume that the concentration of a given particle within both of PMs 400 and 402 are substantially similar and that the relative concentrations of the particle in the PMs 400 and 402 and VTM 108 are such that equilibrium is not achieved for the door open times shown. There will likely be a greater extent of diffusion between PM 400 and the VTM 108 than that between PM 402 and VTM 108, even though both have the same total amount of door open time. This phenomenon may be described Fick's first law equation (2).

As applied to the present situation, when diffusion begins after PM doors 401 and 403 open, the magnitude of flux depends upon the gradient of concentration between the VTM 108 and PMs 400 and 402. Because the gradient will tend to decrease as diffusion occurs, the flux will also decrease over the period the doors are open. When a PM door closes, it allows the gradient to be reestablished through intra-compartment diffusion. As a result, the net diffusion into the VTM 108 from PM 400 may be greater than that of PM 402 under the conditions described, even when both PM door 401 and PM door 403 have the same total open time. It is thus contemplated that PM door states 401a, 403a, 405a, and 407a are to be used to in addition to total door open time for correlating the origin of given particles when particle measurements are made via sensor 101.

Figure 5:
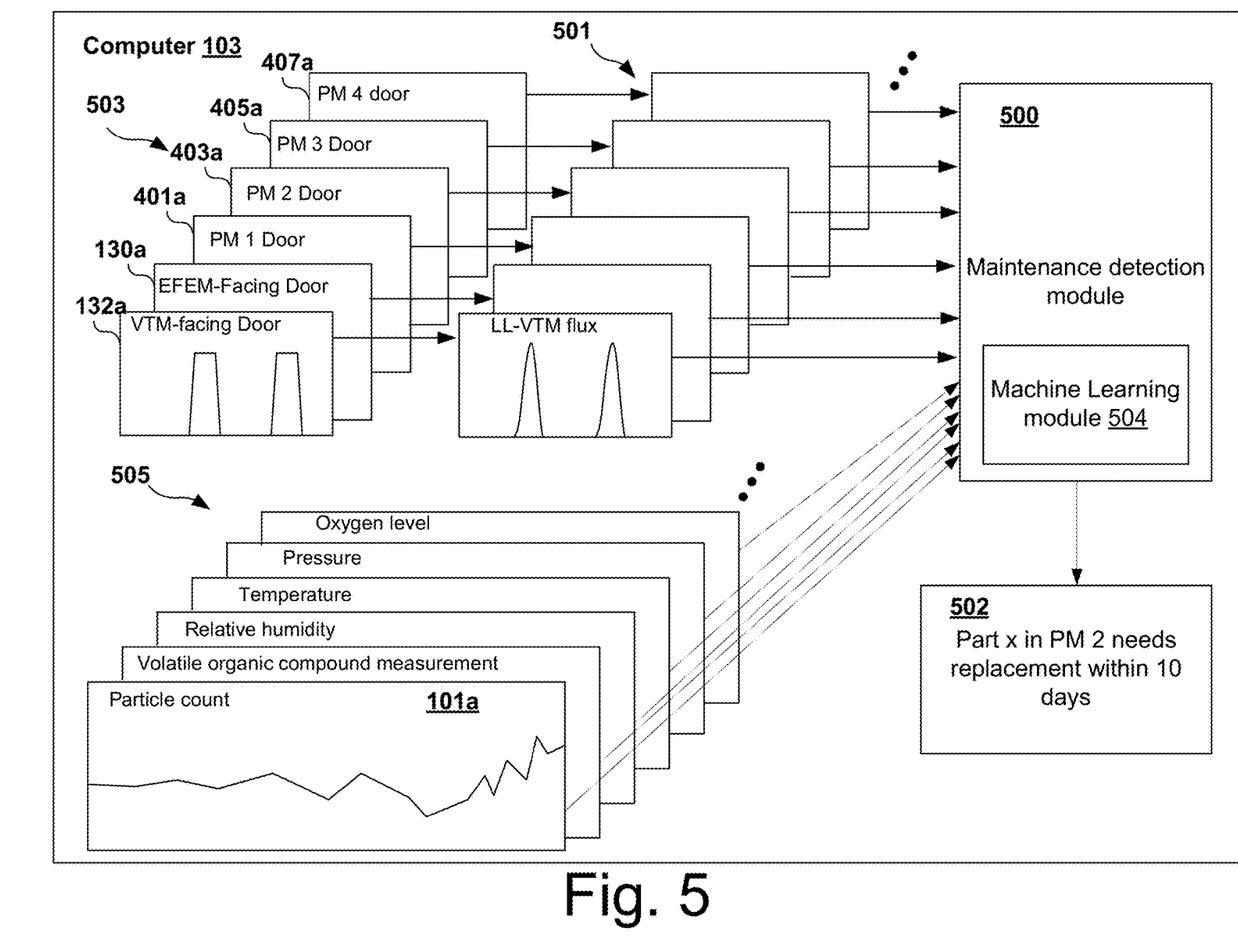
FIG. 5 shows a maintenance detection module of a computer using various door state data and various sensor data for detecting that a component within a substrate process system needs maintenance, according to one embodiment.

FIG. 5 shows a maintenance detection module 500 of computer 103 using various door state data 503 and various sensor data 505 for detecting that a component within a substrate process system needs maintenance, according to one embodiment. The computer 103 is shown to have door state data for each of the VTM-facing door, the EFEM-facing door, as well as each of the PM doors. The door state data 503 may be converted to flux data 501, which describes the extent of diffusion between two compartments given the nature and extent of the door state data 503. The flux data 501 is inputted into the maintenance detection module 500. Additionally, sensor data 505 may be gathered in real time for a number of properties. For example, one or more of the particle counts, volatile organic compound (VOC) measurements, relative humidity (RH) measurements, temperature and pressure measurements, and the oxygen level measurements may be obtained at from sensor 101.

This data is inputted into the maintenance detection module 500 for determining, for example, a profile of the particles detected, including the particle count and size, whether the particles are organic or inorganic, etc. From this data, the maintenance detection module 500 may be able to classify the source of contamination as an oil leak, a seal degradation, or a process chemical residue, etc. Additionally, from the door state data 503, the maintenance detection module 500 determines the proportion of the particle profile that is attributable to each of the various compartments, e.g., the VTM, the EFEM, and PMs 1-4. Thus, the maintenance detection module 500 is able to determine the source of the airborne particles senses as well as the type of maintenance that is most beneficial. For example, in FIG. 5, the maintenance detection module 500 generates a prompt 502 that part x of PM 2 requires replacement within 10 days.

In conjunction with the machine detection module 500, a machine-learning module 504 is also contemplated to be used to predict with greater accuracy and confidence the component needing maintenance and that nature and extent thereof. The machine-learning module 504 may be implemented by computer 103 or it may be implemented at a remote server that communicates with computer 103. In any case, the machine-learning module 504 may use a supervised learning algorithm that detects features associated with the various door state data 503 and the sensor data 505 for classification by a maintenance detection model. The machine-learning module 504 may be provided with training data that provides ground truth relative to what features a set of sensor data and door state data will have when various components are in need of replacement, for example, due to wear and tear, degradation, contamination, deterioration, etc.

Any suitable machine-learning algorithm may be implemented to meet the needs of the operator and the machine-learning module 504. Some may include, but are not limited to a Bayesian network, linear regression, decision trees, neural networks, k-means clustering, and the like. The machine-learning is contemplated to be "supervised" because when the operator is prompted for some maintenance, the operator may then evaluate the accuracy of the machine-learned prompt while performing the maintenance. If the prompt is accurate, the operator may label the prompt "true," and if the prompt is not accurate, the operator may label the prompt as "false," along with any notations indicating his or her findings as to the actual need for maintenance. In this fashion, the machine-learning algorithm may learn from the operator of a particular machine, and if the machine-learning algorithm is distributed across many computers 103, the machine-learning algorithm may learn from thousands of semiconductor processing machines and operators. In certain embodiments, the maintenance detection module 500 and or the machine-learning module 504 may be provided as a service to operators of semiconductor processing system.

Figure 6:
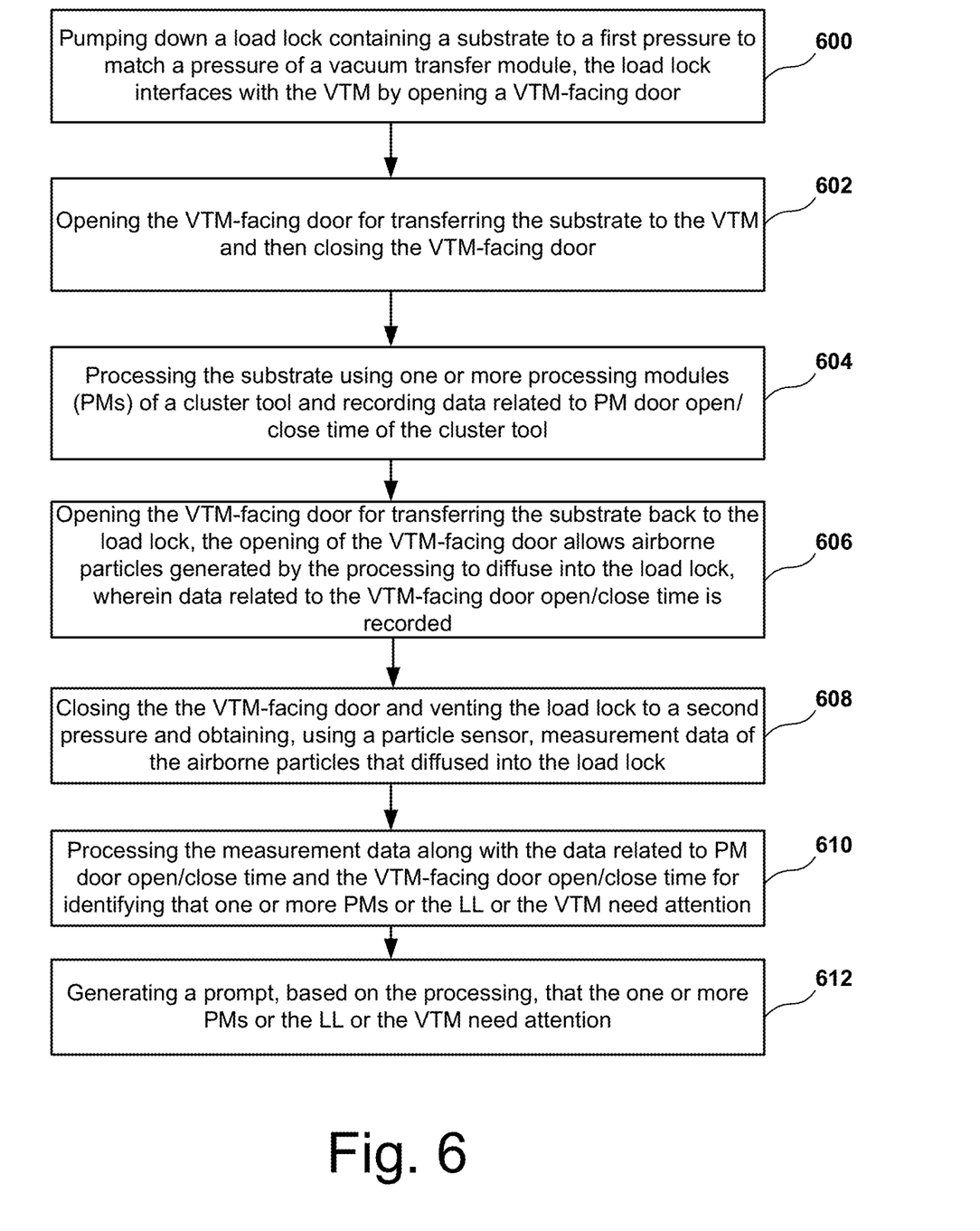
FIG. 6 shows a method for identifying the source of airborne particles and for detecting a maintenance need of a semiconductor processing system via in-situ sensors, according to one embodiment.

FIG. 6 shows a method for identifying the source of airborne particles and for detecting a maintenance need of a semiconductor processing system via in-situ sensors, according to one embodiment. In operation 600, the method provides for pumping down the load lock containing a substrate to a first pressure to match a pressure of a VTM, the first pressure being a high vacuum in many circumstances. Once the load lock is at vacuum, operation 602 serves to open the VTM-facing door of the load lock such that the substrate may be transferred to the VTM. The VTM-facing door may then be closed. A robot arm of the VTM proceeds to place the substrate into one of a plurality of PMs for processing, including, but not limited to, deposition via physical vapor deposition (PVD), chemical vapor deposition (CVD), atomic layer deposition (ALD), electrochemical deposition (ECD), plasma etching by transformer-coupled plasma (TCP) or inductively coupled plasma (ICP), ion beam etching (IBE), lithography, and sputtering. During these processes, doors for the PMs will open and close and allow any airborne particles originating from the PMs to accumulate into the VTM. The composition of the airborne particles within the VTM will depend upon the door states of the PMs. PMs that have a higher average of open time will contribute more to the composition than PMs with lower averages of open times.

When the substrate is finished processing, operation 606 serves to open the VTM-facing door such that the substrate may be retrieved from the VTM to the LL. During the period while the VTM-facing door is open, the airborne particles that have accumulate in the VTM will have an opportunity to diffuse into the LL. In some embodiments, the contents of the VTM may have time to homogenize prior to the opening of the VTM-facing door. In any case, the VTM-facing door state data is captured either empirically or from a sequencer of the computer. The sequencer will contain data related the number of times each of the doors is open and closed. The door open/closed time may be approximated by prior calibration or through manufacturer data.

Operation 608 serves to capture those airborne particles that have diffused into the LL by closing the VTM-facing door. Additionally, operation 608 serves to vent, or re-pressurize the LL to a second pressure, the second pressure being atmosphere in many embodiments. Further, operation 608 serves to obtain measurement data of the contents of the LL, which should include any airborne particles that accumulated in the VTM during processing and that diffused into the LL during transfer of the wafer. At operation 610, the method provides for processing the measurement data obtained from the sensor and the door state data for identifying one or more of the PMs, or the LL, or the VTM for which maintenance would be desired. In some embodiments, the LL may be separately measured by, for example, pumping out any airborne particles originating from the EFEM or the VTM and subsequently venting the LL. Any airborne particles within the LL is likely to be from contamination of the LL itself. Those airborne particles may be measured with the sensor in a similar manner as in operation 608. The method is thus able to generate a prompt in operation 612 that apprises the operator that one or more of the PMs, the LL, or the VTM need attention. In some embodiments, the prompt generated at operation 612 may be for auto-cleaning on one of the VTM, the LL, or the PMs. Additionally, the prompt in operation 612 may specify the type of maintenance predicted to be desirable. For example, the prompt may specify that there is O-ring degradation, an oil leak, lip seal leak due to mechanical or chemical wear.

Figure 7:
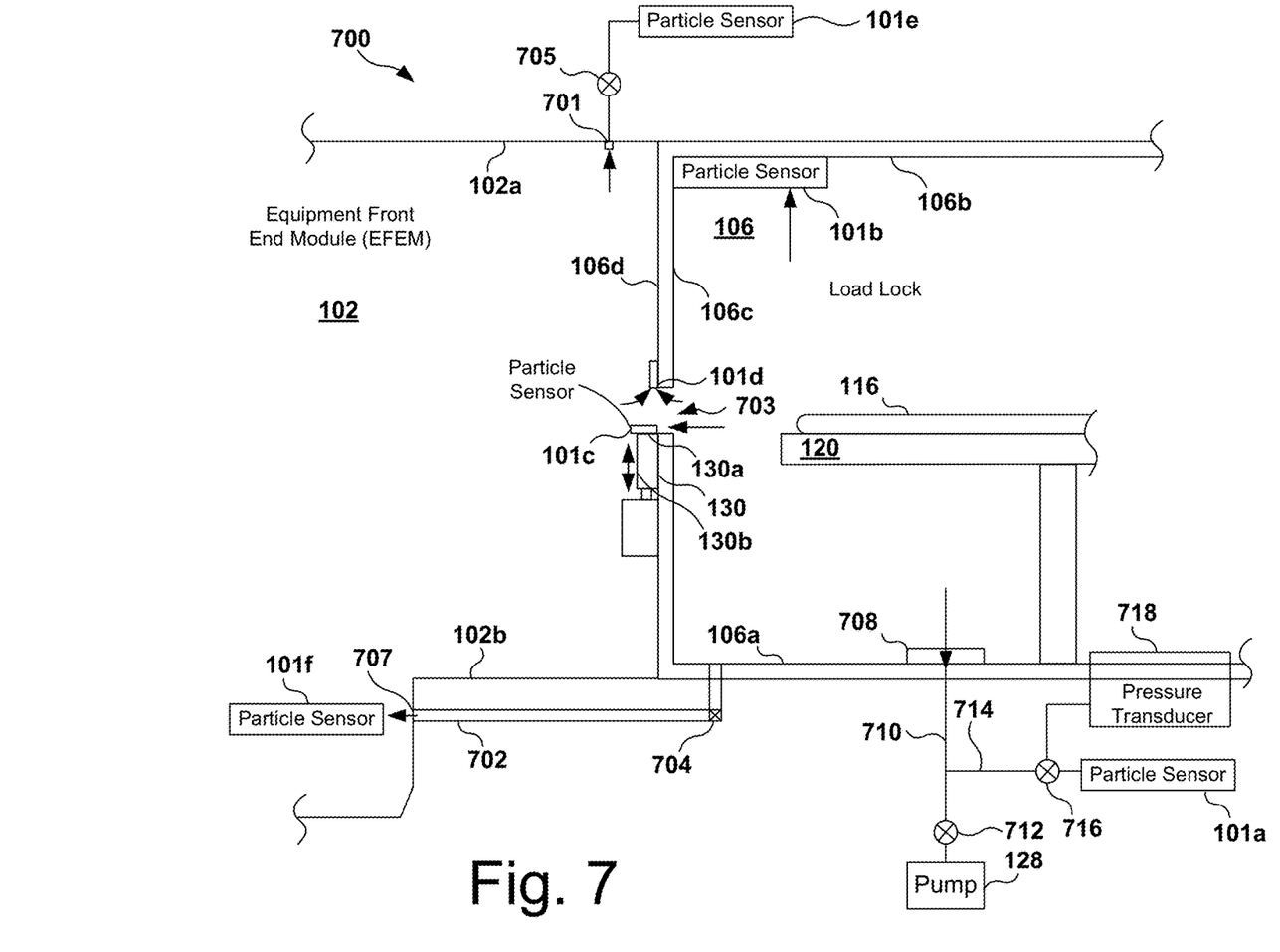
FIG. 7 depicts an interface at which the EFEM and the LL meet and various locations for placement of sensors for tool health monitoring purposes, according to one embodiment.

FIG. 7 depicts an interface 700 where the EFEM 102 and the LL 106 meet and various locations for placement of sensors 101*a-f* for real-time tool health monitoring, according to one embodiment. Within the load lock 106, an outlet 708 is shown at the lower horizontal surface 106*a* to connect the LL 106 to a pump 128 for pumping down the LL 106 down to vacuum. A foreline 710 and a valve 712 are disposed between the outlet 708 and the pump 128. One of the particle sensors 101*a* is shown to be connected to the foreline 710 via line 714 having a valve 716. A pressure transducer 708 is physically connected to the LL 106 and sends a signal to the particle sensor 101*a*. During operation, when the pump 128 is on and valve 712 is open, valve 716 is closed and particle sensor 101*a* is off. In this manner, only contents from the LL 106 are evacuated by pump 128. Subsequently, when the LL 106 achieves atmosphere by venting, a pressure transducer 718 may detect the pressure in the LL 106 or the foreline 710 via line 714 and open valve 716. This allows contents from the LL 106, which is at atmosphere, to travel into the particle sensor 101*a*. The particle sensor 101*a* may be equipped with a fan to induce flow of the contents of the LL 106 into the particle sensor 101*a*. In this configuration, airborne particles present in the LL 106 may be measured fairly directly because the airborne particles are flown into the particle sensor 101*a*. However, airborne particles originating from the EFEM 102 may require time to diffuse into the LL 106 for measurement by sensor 101*a*.

Particle sensor 101*b* is shown to be located inside of LL 106 at an upper horizontal surface 106*b*, although the particle sensor 101*b* may also be placed on the lower horizontal surface 106*a*, or a vertical surface 106*c*. In this configuration, the particle sensor 101*b* may be configured to operate when the pressure inside the LL 106 is above a certain threshold. In some embodiments, measurement data from the particle sensor 101*b* may not be reliable under a certain threshold pressure. In some embodiments, the particle sensor 101*b* will include a wireless transmission module to communicate measurement data to the computer. Any suitable wireless transmission bandwidth or protocol may be used for this purpose.

Particle sensor 101*c* is shown to be mounted to an upper surface 130*a* of EFEM-facing door 130 such that it is kept at atmosphere and obtains measurement data of the EFEM 102 when the EFEM-facing door 130 is closed and obtains measurement data of the LL 106 when the EFEM-facing door 130 is open. In some embodiments, the particle sensor 101*c* is directional in the sense that it has an opening facing some direction. In certain embodiments, the opening of the particle sensor 101*c* may face toward the LL 106, or the EFEM 102, or may have an opening that faces both of the aforementioned. In another embodiment that is not shown, the particle sensor may be mounted on a vertical surface 130*b* of the EFEM-facing door 130. As with particle sensor 101*b*, particle sensor 101*c* may include a wireless communication module to transmit and receive data to and from the computer.

Particle sensor 101*d* is shown to be mounted to the vertical outer surface 106*d* immediately above a door opening 703 of the LL 106. The positioning of the particle sensor 101*d* is such that airborne particles present in the LL 106 need not diffuse very far before being picked up by the sensor 101*d*. Particle sensor 101*e* is in fluid communication with the EFEM 102 via an outlet 701 and a valve 705. The outlet 701 may be defined from an upper horizontal surface 102*a* of the EFEM 102 or may be defined from a lower horizontal surface 102*b*. Particle sensor 101*e* may be equipped with a fan to flow the airborne particles from the EFEM 102 and the LL 106 into the particle sensor 101*e*.

Particle sensor 101*f* may be placed inside the EFEM 102 at the mouth of an equalization port 707 of an equalization channel 702. The equalization channel 702 ensures that the pressure between the LL 106 and the EFEM 102 are similar before opening EFEM-facing door 130. The particle sensor 101*f* may be connected to the equalization port 707 for ease of use.

Figure 8:
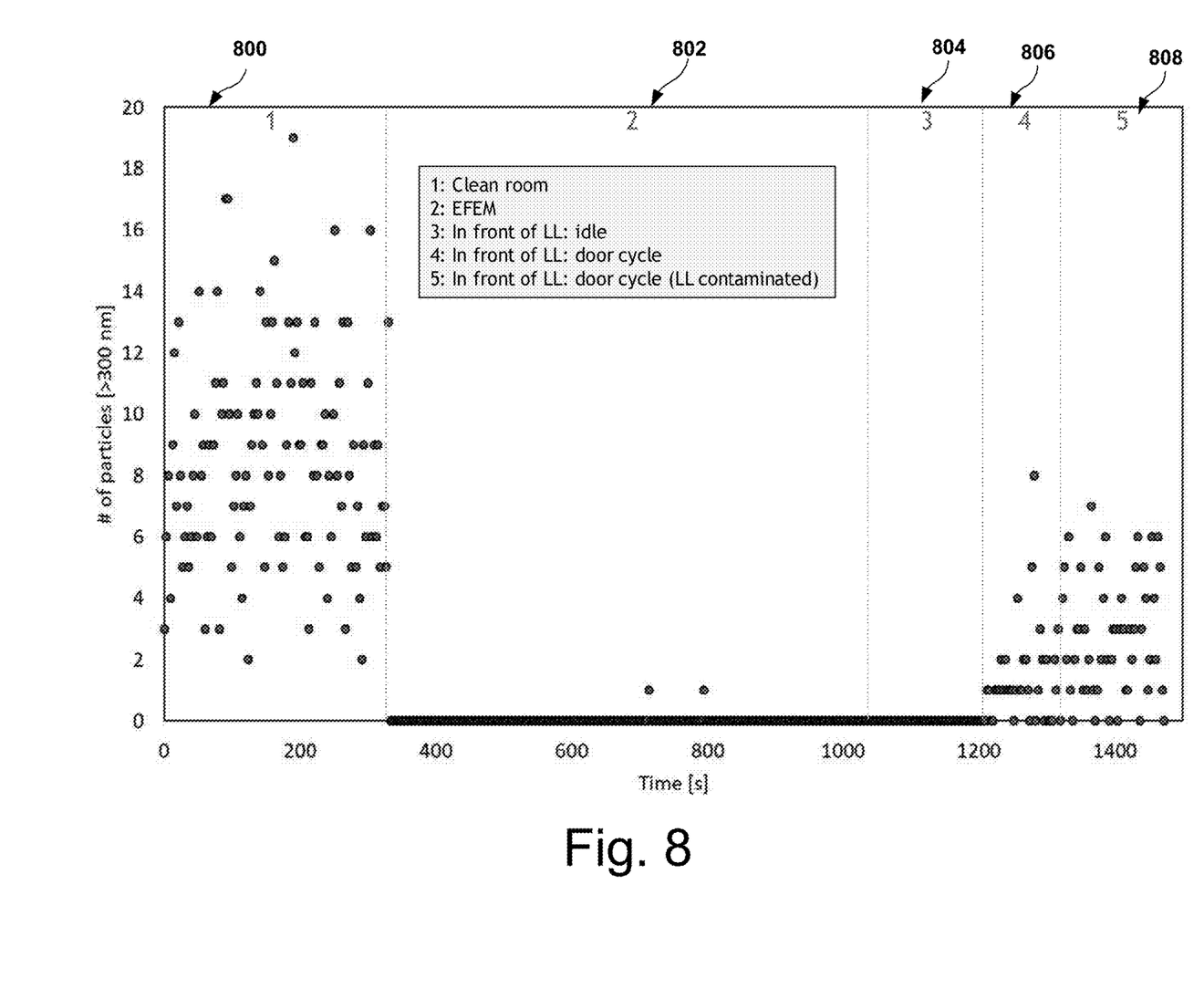
FIG. 8 shows experimental data gathered from various particle sensor locations under various circumstances, according to one embodiment.

FIG. 8 shows experimental data gathered from various particle sensor locations under various circumstances, according to one embodiment. Data points are for particles of 300 nm or greater in diameter of a laser-based particle counter. Measurement period 800 is performed at a location within a clean room and results in relatively high particle counts. Subsequent measurement periods 802 and 804 show that particle counts within the EFEM and in front of the LL (e.g., sensors 101*c* and 101*d*) are significantly lower that within the clean room in general. When the EFEM-facing door of a clean LL is cycled open and closed, the measurement period 806 shows an increase in particle count as compared to that of measurement period 804 when the LL with the EFEM-facing door is closed. Some of the increase in particle count may be due to increase air flow around the particle sensor resulting from the door opening and closing, as well as gas exchange between the LL and the EFEM. In measurement period 808, the particle sensor is kept in front of a LL that is contaminated while the EFEM-facing door is cycled opened and closed. Particle counts are measured to be at least twice that of the prior measurement period 806, indicating that a contaminated LL is detectable using experimental methods.

Figure 9:
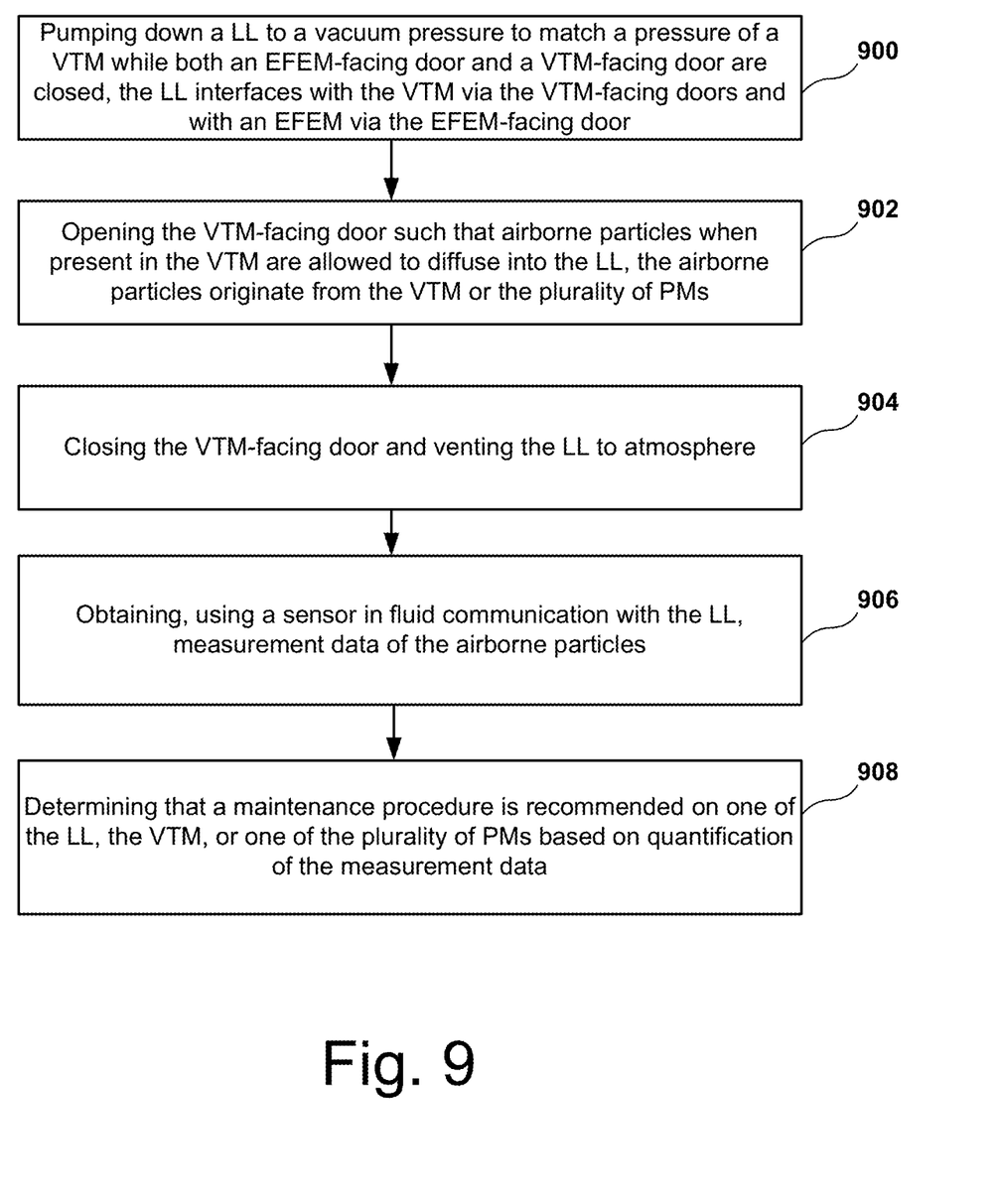
FIG. 9 shows an overall flow of a method for automatically determining if a maintenance procedure on a tool is recommended based on sensor measurement data, according to one embodiment.

FIG. 9 shows an overall flow of a method for automatically determining if a maintenance procedure is recommended based on sensor measurement data, according to one embodiment. At operation 900, the LL is pumped down to a vacuum pressure to match a pressure of a VTM while both an EFEM-facing door and a VTM-facing door are closed. The LL interfaces with an EFEM via the EFEM-facing door and with the VTM via the VTM-facing door. In operation 902, the VTM-facing door is opened such that airborne particles in the VTM are allowed to diffuse into the LL. The airborne particles generally originate from the VTM or one or more of the plurality of PMs, although some, in theory, could originate from the LL and the EFEM. In operation 904, the VTM-facing door is closed so that the LL may be vented to atmosphere. This is typically done with nitrogen, although other gases are possible. Without first opening the EFEM-facing door, the airborne particles are subject to measurement by a sensor that is in fluid communication with the LL. This is so that the airborne particles measured will be known to be from the VTM and not from the EFEM. In other embodiments, the EFEM-facing door may be opened prior to making the measurements using the sensor. In operation 908, a maintenance detection module is used to determine that a maintenance procedure is recommended for one of the LL, the VTM, or one of the plurality of PMs or some combination thereof. This maintenance procedure recommendation is based on the measurement data may also be based on door state data. The maintenance detection module may also identify which of the LL, the VTM, or which of the plurality of PMs are to be recommended for the maintenance procedure. The method shown in FIG. 9 is contemplated to be run for each cycle of pumping and venting such that real-time monitoring of tool health is achieved. In other embodiments, the pumping and venting may be performed intermittently, for example, after every 5, 10, 20, 50 or 100 or more cycles of pumping and venting.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A method, comprising:
 pumping down a load lock (LL) to a vacuum pressure to match a pressure of a vacuum transfer module (VTM) while both an equipment front end module (EFEM)-facing door and a VTM-facing door are closed, the LL interfaces with the VTM via the VTM-facing door and with an (EFEM) via the EFEM-facing door, wherein the VTM interfaces with a plurality of processing modules (PMs) having a respective plurality of PM doors;
 opening the VTM-facing door such that airborne particles when present in the VTM are allowed to diffuse into the LL, the airborne particles originate from the VTM or ones of the plurality of PMs;
 closing the VTM-facing door and venting the LL to atmosphere, wherein after the LL is at atmosphere using a sensor to obtain measurement data of the airborne particles that diffused into the LL from the VTM after said opening and then closing of the VTM-facing door; and
 determining that a maintenance procedure is recommended on one of the LL, the VTM, or the plurality of PMs based on a quantification of the measurement data.

2. The method of claim 1, further comprising:
 obtaining door state data related to open and close times of the VTM-facing door and the plurality of PM doors;
 wherein said determining that the maintenance procedure is recommended is further based on the door state data.

3. The method of claim 2, wherein the door state is used by the maintenance procedure to calculate a proportion of airborne particles originating from each of the plurality of PMs and the VTM for identifying which of the VTM, the LL, or the plurality of PMs is required for the maintenance procedure.

4. The method of claim 1, further comprising:
 generating a prompt for display to an operator based on said determining that the maintenance procedure is recommended;
 wherein the prompt enables the operator to perform the maintenance procedure on one of the VTM, the LL, or ones of the plurality of PMs.

5. The method of claim 1, wherein the sensor includes a laser-based particle sensor and the measurement data includes particle count, size, or composition.

6. The method of claim 1, wherein said pumping down the LL, said opening the VTM-facing door, and said closing the VTM-facing door and venting the LL occur as a part of normal operation of a tool having the LL, the EFEM, the VTM and the plurality of PMs.

7. The method of claim 1, wherein said determining that a maintenance procedure is recommended includes communicating with a machine-learning module, the machine-learning module extracts features from the measurement data for classification by a classification model for said determining that the maintenance procedure is recommended.

8. The method of claim 1, wherein the maintenance procedure recommended includes one or more of manual cleaning, auto-cleaning, replacing, recalibrating, repairing, or refurbishing.

9. The method of claim 1, wherein the measurement data includes one or more of a particle count, particle size, volatile organic compound levels, oxygen levels, temperature, pressure, or relative humidity.

10. A method comprising:
 pumping a loadlock (LL) to atmosphere, the LL being interfaced between an equipment front end module (EFEM) and a vacuum transfer module (VTM);
 opening an EFEM-facing door of the LL while a VTM-facing door is closed, the LL interfaced with the EFEM via the EFEM-facing door and with the VTM via the VTM-facing door, said opening the EFEM-facing door allows airborne particles when present in the EFEM or the LL to diffuse across an opening between the LL and the EFEM, wherein after the LL is at atmosphere using a sensor disposed in the EFEM to obtain measurement data of the airborne particles that diffused across the opening and toward the EFEM; and
 determining that a maintenance procedure is recommended on either the LL or the EFEM based on quantification of the measurement data.

11. The method of claim 10, wherein the LL is vented prior to said opening the EFEM-facing door.

12. The method of claim 10, further comprising:
 obtaining door state data related to open and close times of the EFEM-facing door;
 wherein said determining that the maintenance procedure is recommended is further based on the door state data.

13. The method of claim 10, further comprising:
 generating a prompt for display to an operator based on said determining that the maintenance procedure is recommended;
 wherein the prompt enables the operator to perform the maintenance procedure on the LL or the VTM.

14. The method of claim 10, wherein the sensor includes a laser-based particle sensor and the measurement data includes particle count, and wherein said determining that the maintenance procedure is recommended includes detecting that the particle count is above a threshold.

15. The method of claim 10, wherein the maintenance procedure includes maintenance procedure recommended includes one or more of manual cleaning, auto-cleaning, replacing, recalibrating, repairing, or refurbishing.

16. The method of claim 10, wherein the measurement data includes one or more of a particle count, particle size, volatile organic compound levels, oxygen levels, temperature, pressure, or relative humidity.

17. A system, comprising:
a loadlock (LL) that interfaces with an equipment front end module (EFEM) via an EFEM-facing door and with a vacuum transfer module (VTM) via a VTM-facing door, wherein the VTM is configured to interface with a plurality of process modules (PMs) having PM doors;
a sensor coupled to the LL for obtaining measurement data of airborne particles that diffuse into the LL from the EFEM or the VTM;
a valve disposed along a line between the sensor and the LL, the valve is opened after a pressure of the LL is at atmosphere and is closed when the pressure of the LL is placed at vacuum, wherein the sensor is configured to obtain the measurement data when the LL is confirmed to be at atmosphere by a pressure transducer; and
a computer module configured for processing measurement data received from the sensor for determining that a maintenance procedure is recommended on one of the LL, the VTM, the EFEM, or the plurality of PMs.

18. The system of claim 17, wherein the computer module is further configured for processing door state data relating to the open and close times of the EFEM-facing door, the VTM-facing door, and the plurality of PM doors for said determining that the maintenance procedure is recommended one of the LL, the VTM, the EFEM, or the plurality of PMs.

19. The system of claim 18, wherein the computer module identifies which of the LL, the VTM, the EFEM, or which of the plurality of PMs require the maintenance procedure.

20. The system of claim 17, wherein the sensor includes a laser-based particle sensor and the measurement data includes particle count, and wherein said determining that the maintenance procedure is recommended includes detecting that the particle count is above a threshold.

* * * * *